United States Patent Office 3,396,059
Patented Aug. 6, 1968

3,396,059

PROCESS OF GROWING SILICON CARBIDE P-N JUNCTION ELECTROLUMINESCING DIODES USING A MODIFIED TRAVELLING SOLVENT METHOD

Rosario P. Giammanco, North Reading, Mass., assignor to National Research Corporation, Cambridge, Mass., a corporation of Massachusetts No Drawing. Filed Sept. 14, 1964, Ser. No. 396,393
1 Claim. (Cl. 148—171)

ABSTRACT OF THE DISCLOSURE

The process for growing sharp essentially void-free and intrinsic-"i"-region-free silicon carbide P-N junction diodes using a modified travelling solvent method wherein P and N silicon carbide crystals coated on the contacting surfaces with a stratum of chromium are placed in a carbon susceptor heater in a sandwich-like fashion with a piece of chromium about 10% of the weight of the feed crystal placed at one edge of the silicon carbide sandwich, said sandwich system being subjected to a two-step heating process, the first step of the heating process being approximately 100° C. cooler than the second step.

This invention relates to the production of silicon carbide junction diodes and more particularly to improved silicon carbide junction diodes having unusual electroluminescent properties.

The principal object of the present invention is to provide an improved process for growing silicon carbide junction diodes utilizing the travelling solvent method (TSM) wherein a silicon carbide solvent, such as chromium, is passed through a wafer of silicon carbide to provide epitaxial growth of dissolved silicon carbide on a seed crystal of silicon carbide.

Another object of the invention is to provide a process of the type giving a sharp junction substantially free of voids and having freedom from an intrinsic region at the P-N junction.

In the production of silicon carbide devices and particularly the formation of light-emitting junction diodes, it has been discovered that certain silicon carbide junction diodes having abrupt junctions as characterized by (a) low forward voltage characteristic, (b) high zero voltage capacitance and (c) high dislocation density at the junction, exhibit extremely interesting optical characteristics. When biased in the forward direction and subjected to high current density in the forward direction, such diodes exhibit stimulated emission of radiation and produce extremely intense light of very narrow band width of about 4560 angstroms. When such a diode is formed with the proper optical cavity, the light emitted indicates spatial coherence as well as an extremely narrow band width of emission.

While diodes produced by the travelling solvent method described by Rosenberg et al. (Electronic News, Sept. 2, 1963), have extremely interesting capabilities, their production is difficult to achieve on a uniform, reproducible basis with a yield of acceptable diodes having the capability of high efficiency stimulated emission in the blue portion of the visible spectrum.

In accordance with the present invention, the general techniques described by Rosenberg et al. are employed, but these techniques are substantially modified by providing a minimum amount of chromium in the sandwich comprising two layers of silicon carbide and a stratum of chromium. It has been discovered that when an amount of chromium of 10% or less of the weight of the crystal to be dissolved is employed, numerous important practical advantages are achieved. While not all of the reasons for these improved results are fully understood, it is believed that the use of a relatively small amount of chromium provides a much thinner molten zone, thus creating less opportunity for widespread interdiffusion of acceptors and donors between the P and the N crystals. As a consequence, junctions grown with the small amount of chromium appear to have sharp junction with a minimum, essentially undetectable, intrinsic "i" region. Accordingly, such crystals have very low forward voltage and provide high zero voltage capacitance and show band narrowing with increase of current when biased in the forward direction.

The improved crystal growing results are also preferably achieved by providing a two-step heating process, wherein the initial formation of the molten chromium-silicon carbide eutectic is achieved at the lowest possible temperature, e.g. about 1650° C., to provide initiation of the zone passing technique. After approximately one-half hour when the liquid zone has moved perceptibly away from the junction, the temperature of the zone is increased substantially, e.g. by 100° C. or so, to 1750° C., thereby increasing the speed of passage of the zone through the remainder of the feed crystal. It is believed that the low temperature for the initial epitaxial growth of the junction on the seed crystal provides a minimum amount of diffusion of the acceptors and donors into and through the molten layer. Thus, there is a minimum amount of interdiffusion of acceptors and donors with a minimum amount of creation of an intrinsic "i" layer at the junction.

In a preferred embodiment of the present invention, it has been ascertained that greatly improved results have been obtained by utilizing a small piece of chromium which is placed at one edge of the silicon carbide sandwich. It is believed that, as the chromium forms a eutectic alloy with the silicon carbide, it spreads across the sandwich to form a thin molten layer between the two pieces of silicon carbide. At the locus of the original piece of chromium rather drastic solution of the silicon carbide feed crystal and seed crystals takes place. When the zone passing is finished, this initial locus of the piece of chromium is found to be rather porous and unsatisfactory for manufacture of electroluminescent junction diodes. Since this spot is localized at one side of the sandwich, it can easily be cut out of the sandwich which is further diced and polished.

It appears that the gases or impurities in the chromium which are released by the chromium during melting may seriously affect the silicon carbide in the precise region of the initial piece of chromium. The exact mechanism of this effect is not completely known. However, the improvement which can be obtained by placing the initial piece of chromium at the edge of the crystal and the ease with which the inferior portion of the finished diode can be removed are advantages of the invention which are readily ascertained.

In order that the invention may be more fully understood, one preferred method of practicing the invention is set forth in the following nonlimiting example:

Example I

Two single crystals of alpha silicon carbide were selected, these being of the 6H polytype. Each crystal was about 3/16" by 3/16" and 0.015" thick and each weighed approximately 40 milligrams. One of these crystals was a P-type crystal and other was an N-type crystal. The crystals were carefully cleaned in acetone, dried and then placed in a vacuum chamber which was evacuated to about $10^{-9}$ torr. One face of each crystal was then heated by electron bombardment to about 1300° C. for 10 minutes to thoroughly clean the surfaces. Chromium was then evaporated onto the cleaned surfaces to provide an opaque deposit of about 2 to 4 millionths of an inch thick. The crystals were then removed from the vacuum chamber and arranged in a sandwich (as described below) in an induction-heated furnace comprising a carbon susceptor inside of a quartz tube positioned within an RF heating coil. Argon was arranged to flow constantly down the tube at the rate of about 0.5 c.f.m. to maintain a pure argon atmosphere inside the tube.

In arranging the sandwich, the P crystal was placed on the carbon susceptor with its chromium-coated surface facing upward. Next a small piece of chromium 0.009" thick and weighing 4 mgs. (10% of the P crystal weight) was placed adjacent one edge of the upper surface of the P crystal. Next the N crystal, with its chromium surface down, was placed over the P crystal to form the sandwich with the small chromium piece between the edges of the chromium-coated silicon carbide crystals. Since the susceptor was the source of heat for the silicon carbide crystal and since TSM growth occurs towards the hottest surface, therefore, in the arrangement described above, the N (upper) crystal constituted the seed crystal and the P (lower) crystal constituted the feed crystal.

The susceptor block was then inductively heated to a temperature of about 2000° C. as read by an optical pyrometer. However, the temperature was controlled by controlling the temperature of the top surface of the N crystal to about 1650° C. for approximately ½ hour. The temperature of the top surface of the N crystal was measured optically. The temperature at the junction between the N and P crystals was estimated to be approximately 1800° C. After the initial ½-hour treatment with the upper surface of the N crystal at 1650° C., the top surface of the N crystal was then raised to 1750° C. for 2 hours. Thereafter the furnace was cooled and the formed silicon carbide P-N junction was removed from the furnace.

The chromium layer had travelled completely through the P crystal to the carbon susceptor. The chromium was machined off and both outer surfaces of the crystals were polished and then sandblasted. Thereafter ohmic contacts of gold-silicon alloy were placed on the outer faces of the diode. Thereafter the diode was diced, contacts were made to the diode and it was tested with the following results.

FORWARD VOLTAGE CHARACTERISTICS

| I (amps): | V (volts) |
|---|---|
| $10^{-7}$ | 1.5 |
| $10^{-6}$ | 1.7 |
| $10^{-5}$ | 1.9 |
| $10^{-4}$ | 2.0 |
| $10^{-3}$ | 2.1 |
| Zero voltage capacitance ------micromicrofarads-- | 60 |

A single diode having a junction area of 0.0025 square cm. was then biased in the forward direction by use of a D.C. power supply. When the diode was subjected to a current of .005 ampere, it emitted a generally green colored light. As the current was increased to .500 ampere, the light shifted more to the blue and became much more intense.

Since certain changes may be made in the above process without departing from the scope of the invention herein involved it is intended that all matter contained in the above description shall be interpreted as illustrative and not in a limiting sense.

What is claimed is:

1. In the process of growing silicon carbide junction diodes capable of electroluminescing in the plane of the P-N junction, wherein a sandwich is formed comprising outer layers of silicon carbide and an intermediate deposited layer of chromium, one of said silicon carbide layers comprising a seed crystal, the other layer comprising a feed crystal, the improvement which comprises providing a piece of chromium about 10% of the weight of the crystal to be dissolved, said piece of chromium positioned adjacent to one edge of the silicon carbide sandwich at the point where the chromium layer between the two silicon carbide crystals appears, forming a molten chromium-silicon carbide eutectic zone, the temperature of said zone being maintained at about 1650° C. for about the first 30 minutes of zone passing, thereafter increasing the temperature substantially after the junction has been formed, the result of said piece of chromium being so arranged is that defects in the junction created by gaseous impurities emanating from the chromium during formation of the initial chromium silicon carbide eutectic are localized at the situs of said piece of chromium to permit removal and discarding of the inferior section of the finished junction diode.

References Cited

UNITED STATES PATENTS

| | | | |
|---|---|---|---|
| 2,813,048 | 11/1957 | Pfann | 148—1.5 |
| 2,996,415 | 8/1961 | Hergenrother | 148—176 |
| 2,996,456 | 8/1961 | Hergenrother | 148—176 |
| 3,205,101 | 9/1965 | Mlavsky et al. | 148—174 |
| 3,301,716 | 1/1967 | Kleinknecht | 148—1.5 |

HYLAND BIZOT, *Primary Examiner.*

P. WEINSTEIN, *Assistant Examiner.*